United States Patent [19]

Werner et al.

[11] Patent Number: 5,505,833

[45] Date of Patent: Apr. 9, 1996

[54] METHOD FOR DEPOSITING A LAYER ON A SUBSTRATE WAFER WITH A SPUTTERING PROCESS

[75] Inventors: Christoph Werner, Moosach; Alfred Kersch, Munich, both of Germany

[73] Assignee: Siemens Aktiengesellschaft AG, Munich, Germany

[21] Appl. No.: 272,589

[22] Filed: Jul. 11, 1994

[30] Foreign Application Priority Data

Jul. 26, 1993 [DE] Germany ............................ 43 25 051.3

[51] Int. Cl.⁶ .................................................. C23C 14/34
[52] U.S. Cl. .............................. 204/192.12; 204/298.11
[58] Field of Search ........................... 204/192.12, 298.11

[56] References Cited

U.S. PATENT DOCUMENTS

| | | | |
|---|---|---|---|
| 4,824,544 | 4/1989 | Mikalesen et al. ................ | 204/298.06 |
| 4,988,424 | 1/1991 | Woodward et al. ............... | 204/192.29 |
| 5,223,108 | 6/1993 | Hurwitt ............................ | 204/192.12 |
| 5,380,414 | 1/1995 | Tepman .......................... | 204/192.3 |
| 5,415,753 | 5/1995 | Hurwitt et al. ................... | 204/192.12 |

FOREIGN PATENT DOCUMENTS

| | | | |
|---|---|---|---|
| 0509305A1 | 10/1992 | European Pat. Off. ......... | 204/192.12 |
| 285289A7 | 1/1991 | Germany ....................... | 204/298 |
| 61-577 | 1/1986 | Japan ............................ | 204/298.11 |
| 63-310965 | 12/1988 | Japan ............................ | 204/298.11 |
| 5-263222 | 10/1993 | Japan ............................ | 204/298.11 |

OTHER PUBLICATIONS

Article "Sputtering Tools: Still on Target?", Semiconductor International, Aug. 1992 at 43.
Technical Paper "Modeling of a Sputter Reactor Using the Direct Simulation Monte Carlo Method" IEDM 1992 at San Francisco, Paper No. 76.
Japanese Patent Abstract JP62–077477 A, Sep. 4, 1987, vol. 11, No. 273.
Japanese Patent Abstract JP62–250171, Apr. 22, 1988, vol. 12, No. 132.
Japanese Patent Abstract JP63–310965 A, Apr. 14, 1989, vol. 13, No. 156.
Japanese Patent Abstract JP02–115365 A, Jul. 12, 1990, vol. 14, No. 326.

*Primary Examiner*—Aaron Weisstuch
*Attorney, Agent, or Firm*—Hill, Steadman & Simpson

[57] ABSTRACT

A method for depositing a layer on a substrate is disclosed wherein a collimator having cylindrical holes is employed to reduce the lateral component of a particle flux. The cylindrical holes are aligned to be perpendicular to a substrate wafer and have a variety of radii such that the hole radii are smaller in regions having a higher vertical component of particle flux than in regions which have a lower vertical component of the particle flux.

13 Claims, 2 Drawing Sheets

METHOD FOR DEPOSITING A LAYER ON A SUBSTRATE WAFER WITH A SPUTTERING PROCESS

BACKGROUND OF THE INVENTION

1. Field of the Invention

The present invention relates to a method for depositing a layer on a substrate with a sputtering process and, more particularly, this invention relates to a method for reducing the lateral component of a particle flux in a sputtering process.

2. Description of the Prior Art

Sputtering processes are often applied in semiconductor manufacturing processes for depositing layers of various materials. In these known processes, a plasma is ignited in a sputtering reactor between two electrodes. A sputter target is arranged on the cathode; a substrate wafer on which the layer is to be deposited is arranged on the anode. Positively-charged ions of an inert atmosphere such as argon are accelerated onto the target and eject individual atoms or molecules from the target when they impact the target. The target is composed of a material required for the layer deposition. The particles that are extracted form a particle flux which impacts and distributes in all directions at the target surface. There are two components of sputtered particle fluxes in sputtering processes: a vertical component that vertically impinges the substrate wafer and a lateral component that impinges at a certain angle relative to the surface of the substrate wafer.

Both components of the particle flux contribute to the generation of the layer when a layer is deposited on a substrate wafer having an essentially planar surface. When the substrate comprises structures having aspect ratios of 1 and less than 1, it is essentially only the vertical flux component that contributes to the layer generation. The aspect ratio is the ratio of diameter to depth. Aspect ratios of 1 and less than 1 generally occur when filling via holes with metallization layers. The lateral flux component impacts the side walls of the structures and for the most part covers only the side walls. Consequently, the filling of structures, for example via holes, is made more difficult.

One known solution to this problem is described in an article titled *Sputtering Tools: Still on Target*?, Semiconductor International, August 1992, at page 42, by Ron Iscoff. This article describes the use of a collimator placed between the substrate wafer and the target to intercept the lateral component of the particle flux before it impacts the substrate wafer. Coverage of the side walls of, for example, via holes, is thus avoided, so that the quality of the via hole filling is improved. This, however, also results in a decrease in the deposition rate. Moreover, the deposition rate is not uniformly distributed over the substrate wafer when a collimator is used in a standard sputter reactor without additional modifications. This is due to the fact that standard reactors are designed so that the sum of lateral and vertical flux components is uniform. The vertical component is not independently optimized.

Optimization of the vertical component can be achieved by varying the magnetic field at the target. This results in a vertical flux component having a uniform distribution when viewed independently whereas the lateral flux component has a relatively non-uniform distribution. The lateral flux component is intercepted by the collimator, so that its inhomogeneity does not deteriorate the deposition.

Because the correlation between the homogeneity of the deposition rate and the magnetic field is extremely indirect, optimization of the distribution of the vertical flux component in this manner requires an exhaustive series of experiments. Moreover, modification of the magnetic field is usually only practical if it is performed by the reactor manufacturer. This leads to an additional delay in the process development. Finally, the interception of the lateral component in the collimator leads to aging of the collimator. The lateral flux component creates a layer deposition on the side walls of the holes in the collimator which gradually results in the collimator holes being sputtered shut. This aging effect cannot be reduced or eliminated because the lateral flux component is non-uniform over the expanse of the collimator due to the optimization of the vertical flux component.

SUMMARY OF THE INVENTION

In the improved method of the present invention, a collimator that blocks lateral components of the particle flux is employed in a sputtering process. The collimator is provided with cylindrical holes whose cylinder axis is aligned essentially perpendicularly to the surface of the substrate wafer. The diameter of the holes in the collimator varies from one hole to another. The distribution of the hole radii, in particular, is selected such that the hole radii are smaller in regions having a higher vertical flux component than in regions having lower vertical flux components. The deposition rate arising on the substrate wafer is thereby homogenized.

In many standard sputter reactors, there is a location outside the center of the target on the target at which the maximum sputtering rate occurs. In such reactors, it is desirable to have the hole radii steadily decrease from the center of the reactor up to the location of maximum sputtering at the target and to have the hole radii increase from this location up to a distance from the center corresponding to the wafer edge and to keep the radii constant outside the wafer edge.

In order to avoid problems in the filling of small structures, for example via holes, it is desirable to select the minimum hole radius such that the aspect ratio of the collimator minimum hole radius is equal to the aspect ratio of structures on the surface of the substrate wafer having the smallest diameter.

It is within the scope of the invention to adjust the sputtering rate in the reactor by applying a magnetic field to uniformly set the lateral flux density. Uniform depositions thereby occur over the collimator area and, thus, a uniform aging effect results that can be globally compensated by the sputtering time. The deposition rate can therefore be optimized in a shorter time and without the time-consuming modification of the equipment by the equipment manufacturer. Additionally, the method of the invention can be used to optimize the process by making fine adjustments in this manner after a rough pre-adjustment of the magnetic field has been made by the equipment manufacturer.

In addition to varying the hole radii, it lies within the scope of the invention to vary the spacing between neighboring holes in order to vary the size of the particle flux which is allowed to pass. A part of the vertical flux component is thereby suppressed by impinging upon solid collimator material. In this version of the collimator, an occlusion web can also be provided between neighboring holes. The aspect ratio of the collimator is thus artificially decreased. A part of the lateral flux component that is incident at a sufficiently obtuse angle is cut off at the occlusion webs. This part of the lateral component does not proceed into the side walls of the collimator holes and, therefore, it does not contribute to the aging of the collimator. In this way, the decrease of the hole radius is retarded by reducing the lateral flux component.

The invention is set forth in greater detail below with reference to the drawings and the exemplary embodiments.

DESCRIPTION OF THE PREFERRED EMBODIMENTS

Figure 1:
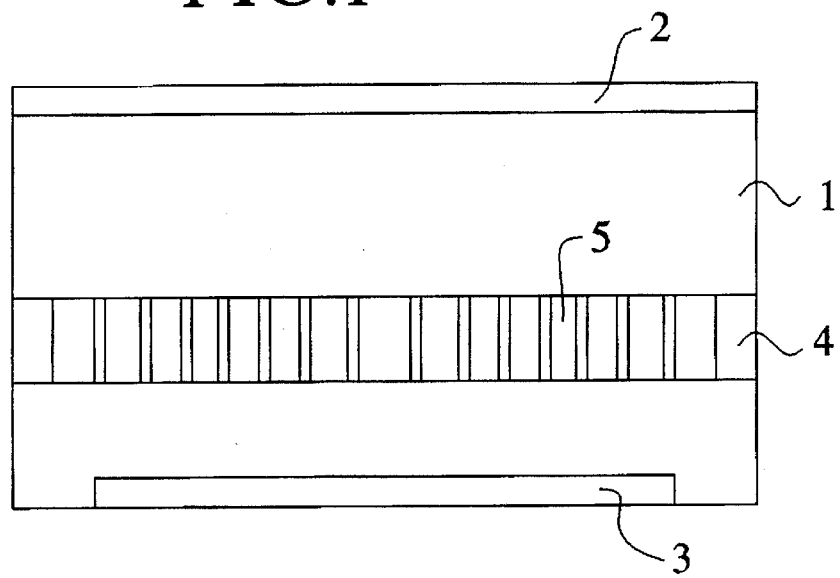
FIG. 1 shows a sputter reactor with a target, a substrate wafer and a collimator having holes with different hole radii.

FIG. 1 shows a section through a sputter reactor 1. Details of the sputter reactor 1 such as electrical connections, gas deliveries, pump connectors or coils for generating a magnetic field have been omitted for clarity. A sputter target 2 is arranged in the sputter reactor 1. A substrate wafer 3 is arranged opposite the sputter target 2 such that the center of the wafer coincides with the center of the sputter reactor 1. The substrate wafer 3 in the example of the preferred embodiment is a silicon wafer on which a micro-electronic circuit is realized having a surface with a passivation layer in which via holes that are to be filled in the sputtering process are opened.

The collimator 4 is arranged between the sputter target 2 and the substrate wafer 3. The collimator includes a plurality of holes 5 that comprise an essentially circular cross section parallel to the surface of the substrate wafer 3. Moreover, the holes 5 are cylindrical. The respective radii of the holes 5 distributed over the collimator 4 are different. Whereas the hole radii are comparatively large in the middle of the sputter reactor 1, they will reach their smallest value at approximately two-thirds of the wafer radius of the substrate wafer 3. A variety of methods can be used to calculate the optimum hole radius. The optimum hole radius can be empirically identified by evaluating the layer deposited on the substrate wafer 3. Alternatively, the distribution of the hole radii may be iteratively calculated with the assistance of a simulation program. These simulation programs are known in the art, one such program is described in a paper titled *Modeling of a Sputter Reactor Using the Direct Simulation Monte Carlo Method* by A. Kersch et al, IEDM 1992, paper 7.6, San Francisco, 1992.

Figure 2:
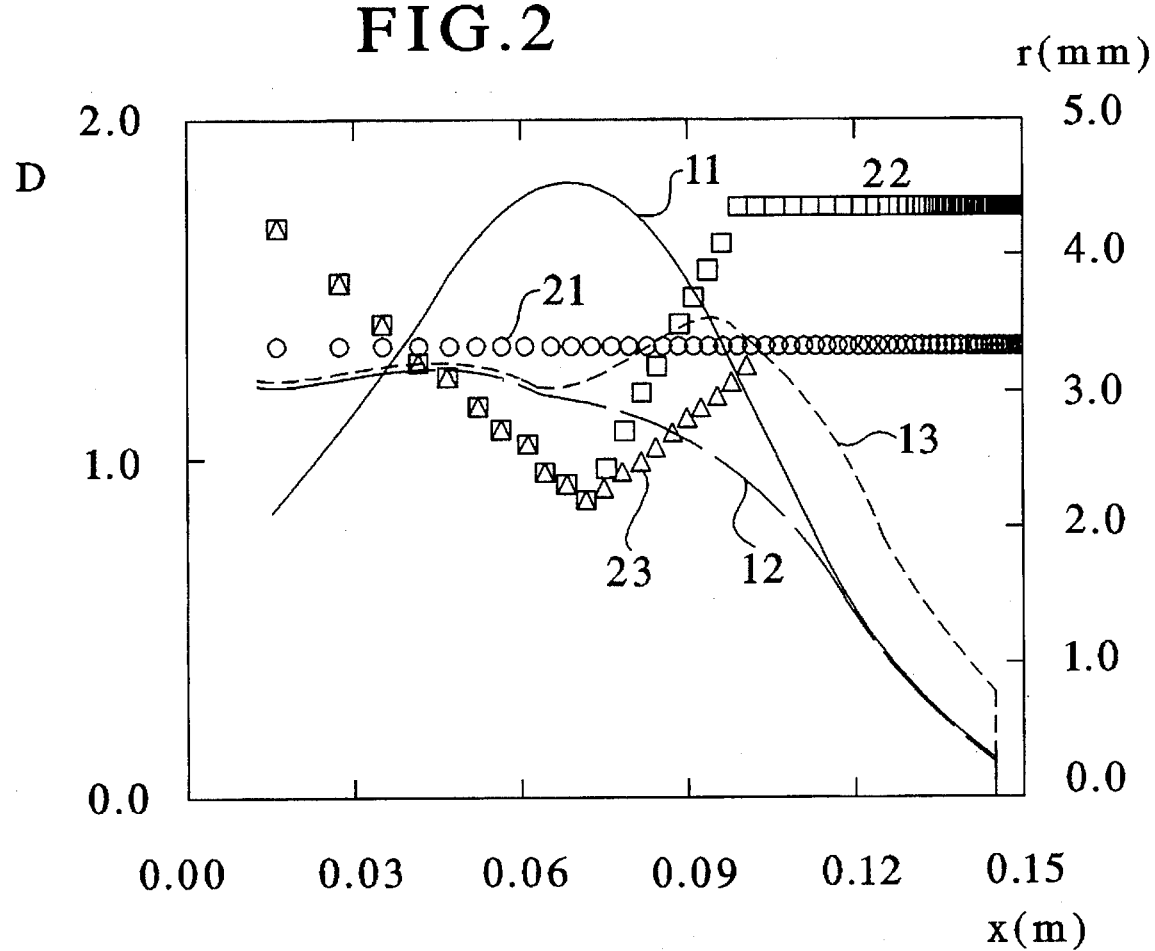
FIG. 2 shows the result of simulation calculations for the deposition rate in a sputtering process given a prescribed distribution of hole radii.

FIG. 2 shows simulation calculations of the deposition rate D as a function of the distance from the middle of the reactor. The reactor rate is thereby normed to a prescribed deposition rate. The deposition rate is respectively calculated for a prescribed distribution of hole radii. The deposition rate is calculated in curve 11 for the case wherein the hole radii comprise the constant distribution indicated in the curve 21. The curve 12 is based on a distribution of hole radii corresponding to curve 22. The deposition rate corresponding to curve 13 thereby results from a distribution of the hole radii corresponding to curve 23. The hole radius is entered at the righthand axis of the diagram.

Figure 3:
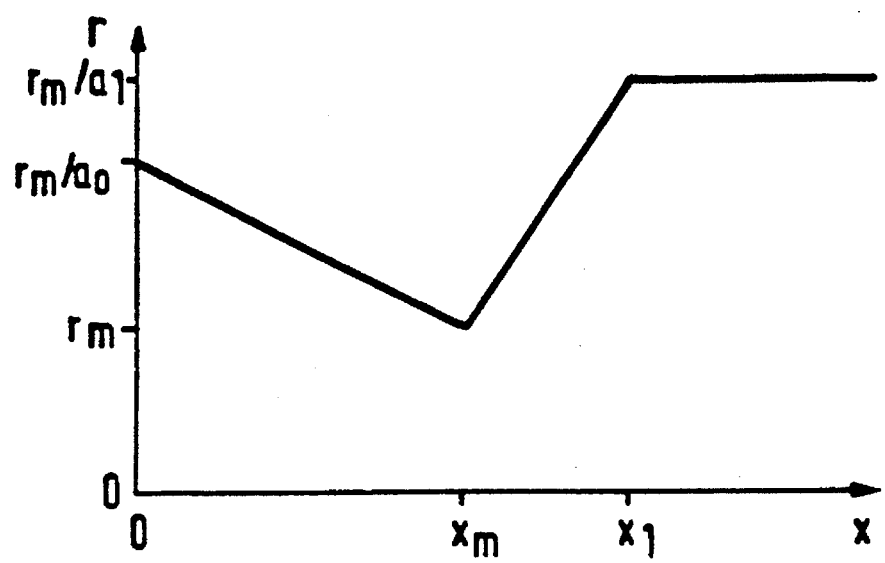
FIG. 3 shows a preferred distribution of hole radii for use with the method of the invention.

FIG. 3 shows a distribution of hole radii as a function of the distance from the reactor middle from which a uniform deposition rate can be achieved relatively quickly based upon empirical data. The distribution is a partially linear function for which the following applies:

$$r(x) = \frac{r_m - r_m/a_o}{x_m} \cdot x + \frac{r_m}{a_o} \text{ for } 0 \leq x \leq x_m$$

$$r(x) = \frac{r_m/a_1 - r_m}{x_1 - x_m} \cdot x + r_m \cdot \frac{x_1 - x_m/a_1}{x_1 - x_m} \text{ for } x_m \leq x \leq x_1$$

$$r(x) = r_m/a_1 \text{ for } x_1 \leq x$$

Where $r_m$ is the minimum hole radius, $x_m$ is the distance from the middle of the reactor to the location of the maximum sputtering rate at the target, $x_1$ is the distance from the middle of the reactor to the edge of the substrate wafer, $a_o$ is the lowering factor of the sputter rate at the middle of the reactor relative to the maximum sputtering rate at the location $x_m$ and $a_1$ is the lowering factor of the sputtering rate at the edge of the substrate wafer relative to the maximum sputtering rate at the location $x_m$.

The distribution of the hole radii takes into account the fact that there is a location at the target in many sputter reactors at which the sputter rate is maximum. This location is usually located at approximately two-thirds of the substrate wafer radius. The location is dependent on the reactor type and can be identified from the erosion profile of a sputtering target after a longer service time. The factors $a_o$ and $a_1$ by which the sputtering rates at the target middle or, respectively, at the wafer edge are lowered relative to the maximum sputtering rate can be identified by measuring the erosion profile. Typical values in standard reactors are $a_o=0.5$, $a_1=0.4$.

The minimum hole radius $r_m$ can be selected such that the aspect ratio $(2r_m)/d$ of the collimator is equal to the aspect ratio of the smallest structures present on the wafer, for example via holes, where d is the thickness of the collimator. The wafer radius $x_1$ is dependent on the size of the substrate wafers and is on the order of 100 mm, for example.

Figure 4:
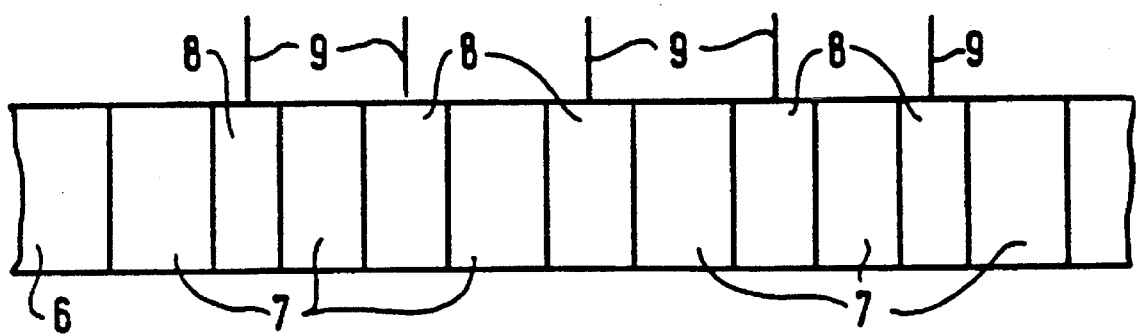
FIG. 4 shows a section through a collimator having holes with different hole radii, different spacings, and with occlusion webs.

FIG. 4 shows a section through a collimator that is utilized in another embodiment of the invention. The collimator 6 comprises holes 7 that have different hole radii and which are separated from one another by webs 8 having different widths. The enlarged width of the webs 8 leads to local attenuation of the vertical flux component of the particles. Occlusion webs 9 are arranged on the webs 8. During operation, the collimator 6 is located between the sputter target and substrate wafer so that the occlusion webs 9 are aligned in the direction of the sputter target. The occlusion webs 9 intercept part of the lateral particle flux component during sputtering. The occlusion webs 9 therefore attenuate that the part of the lateral particle flux component so that deposits at the side walls of the holes 7 are reduced. The aging of the collimator 6 is thus retarded.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A method for depositing a layer on a substrate wafer with a sputtering process, the substrate wafer having a surface and being located within a sputter reactor having a central axis, a target and a collimator, the collimator having a plurality of cylindrical holes each having a radius and an axis and said collimator being located between the substrate wafer and the target, said method comprising the steps of:

disposing at least one occlusion web between a pair of adjacent cylindrical holes;

aligning the axes of the cylindrical holes of the collimator substantially perpendicularly to the surface of the substrate wafer; and generating a particle flux having a vertical and a lateral component, and screening the lateral component by the cylindrical holes.

2. The method for depositing a layer on a substrate of claim 1, comprising the additional step of distributing the cylindrical holes in said collimator having respective radii of different sizes with cylindrical holes having smaller radii in areas of the sputter reactor where the vertical particle flux component is higher than in areas where the vertical particle flux component is lower.

3. The method for depositing a layer on a substrate of claim 1, comprising the additional step of positioning the center of the substrate wafer along the central axis of the sputter reactor.

4. The method for depositing a layer on a substrate of claim 1, comprising the additional step of distributing the cylindrical holes in said collimator with the radii of the cylindrical holes decreasing from the central axis of the sputter reactor to a location of maximum sputtering at the target.

5. The method for depositing a layer on a substrate of claim 1, comprising the additional step of providing the cylindrical holes having respectively identical radii outside the wafer edge.

6. The method for depositing a layer on a substrate of claim 1, comprising the additional step of distributing in said collimator the cylindrical holes with radii r(x) according to the following distribution as a function of the distance x from the central axis of the sputter reactor:

$$r(x) = \frac{r_m - r_m/a_0}{x_m} \cdot x + \frac{r_m}{a_0} \text{ for } 0 \leq x \leq x_m$$

$$r(x) = \frac{r_m/a_1 - r_m}{x_1 - x_m} \cdot x + r_m \cdot \frac{x_1 - x_m/a_1}{x_1 - x_m} \text{ for } x_m \leq x \leq x_1$$

$$r(x) = r_m/a_1 \text{ for } x_1 \leq x$$

where $r_m$ = the minimum hole radius;

$x_m$ = the distance from the central axis of the sputtering reactor to the location of maximum sputtering rate at the target;

$x_1$ = the distance from the central axis of the sputter reactor to the edge of the substrate wafer;

$a_0$ = the lowering factor of the sputtering rate at the central axis of the reactor relative to the maximum sputtering rate at the location $x_m$;

$a_1$ = the lowering factor of the sputtering rate at the edge of the substrate wafer relative to the maximum sputtering rate at the location $x_m$.

7. The method for depositing a layer on a substrate of claim 6, comprising the additional step of determining $x_m$, $a_0$ and $a_1$ by measuring an erosion profile of the target after a selected service time.

8. The method for depositing a layer on a substrate of claim 6, comprising the additional steps of selecting $a_0$ between 0.1 and 0.7; and selecting $a_1$ between 0.1 and 0.7.

9. The method for depositing a layer on a substrate of claim 1, comprising the additional step of projecting the occlusion web beyond the collimator in a plane perpendicular to the cylinder axis of the holes.

10. The method for depositing a layer on a substrate of claim 1, comprising the additional step of annularly surrounding the cylindrical holes of the collimator by a plurality of occlusion webs.

11. The method of depositing a layer on a substrate wafer of claim 1, wherein the substrate further comprises a plurality of small structures on a surface and wherein the step of generating a particle flux comprises filling the small structures with the layer.

12. A method for depositing a layer on a substrate wafer with a sputtering process, the substrate wafer having a surface and being located within a sputter reactor having a central axis, a target and a collimator, the collimator having a plurality of cylindrical holes, each having an axis with a distance between adjacent holes, at least one occlusion web being positioned between a pair of adjacent cylindrical holes, and said collimator being located between the substrate wafer and the target, comprising the steps of:

aligning the axis of the cylindrical holes of the collimator substantially perpendicularly to the surface of the substrate wafer; and generating a particle flux having a vertical and a lateral component, and screening the lateral component by the cylindrical holes.

13. The method for depositing a layer on a substrate of claim 12, distributing said cylindrical holes in said collimator with the distance between adjacent cylindrical holes being greater in areas of the sputter reactor where the vertical particle flux component is higher than in areas where the vertical particle flux component is lower.

* * * * *